(12) United States Patent
Ahmad

(10) Patent No.: US 11,737,240 B1
(45) Date of Patent: *Aug. 22, 2023

(54) HEAT-ACTIVATED MULTIPHASE FLUID-OPERATED PUMP FOR ELECTRONICS WASTE HEAT REMOVAL

(71) Applicant: HAMFOP Technologies LLC, Sacramento, CA (US)

(72) Inventor: Mudasir Ahmad, San Jose, CA (US)

(73) Assignee: Hamfop Technologies LLC, Sacramento, CA (US)

( * ) Notice: Subject to any disclaimer, the term of this patent is extended or adjusted under 35 U.S.C. 154(b) by 7 days.

This patent is subject to a terminal disclaimer.

(21) Appl. No.: 17/471,618

(22) Filed: Sep. 10, 2021

Related U.S. Application Data

(60) Provisional application No. 63/076,546, filed on Sep. 10, 2020.

(51) Int. Cl.
   *H05K 7/20* (2006.01)
   *H01L 23/427* (2006.01)
   *F04F 1/04* (2006.01)

(52) U.S. Cl.
   CPC ........... *H05K 7/20327* (2013.01); *F04F 1/04* (2013.01); *H01L 23/427* (2013.01);
   (Continued)

(58) Field of Classification Search
   CPC ........... H05K 7/20309; H05K 7/20327; H05K 7/20818; H05K 7/20827; F25B 23/006; F04B 19/24; F04F 1/04
   See application file for complete search history.

(56) References Cited

U.S. PATENT DOCUMENTS

| 1,781,541 A | 11/1930 | Einstein et al. |
| 2,927,434 A | 3/1960 | MacCracken |

(Continued)

FOREIGN PATENT DOCUMENTS

| CN | 102410187 A1 | 4/2012 |
| EP | 0251664 B1 | 4/1990 |

(Continued)

OTHER PUBLICATIONS

Printout: David Mytton, "How much energy do data centers use?", https://davidmytton.blog/how-much-energy-do-data-centers-use/, published in Cloud, Data Center Energy, Environment, IT Energy, Feb. 10, 2020, 12 pages.

(Continued)

*Primary Examiner* — Robert J Hoffberg
(74) *Attorney, Agent, or Firm* — Mark Protsik; Thomas Schneck

(57) ABSTRACT

A heat-activated pump removes waste heat from electronic components, at a data center, circuit board, or chip level. A set of evaporators receive heat from the electronics, converting a working fluid into vapor. Piping from the evaporators to a shared condenser(s) and back form a fluid circulation system. A pressure-control valve set for a specified electronic operating temperature allows vaporized working fluid to vent into a liquid-piston chamber, where it expands adiabatically, displacing pumped liquid in a pumping stage and expelling it from the chamber through a unidirectional valve to the shared condenser(s). The condenser(s) has a heatsink transferring heat away to a flow of cooler fluid. The pumped liquid returns in a suction cycle to the chamber through another unidirectional valve. An injector valve returns jets of condensed working fluid to the evaporator in successive brief spurts responsive to periodic pressure pulses in the chamber.

17 Claims, 9 Drawing Sheets

(52) U.S. Cl.
CPC ....... *H05K 7/2069* (2013.01); *H05K 7/20309* (2013.01); *H05K 7/20318* (2013.01); *H05K 7/20681* (2013.01); *H05K 7/20827* (2013.01)

(56) References Cited

U.S. PATENT DOCUMENTS

| | | | |
|---|---|---|---|
| 4,769,997 | A | 9/1988 | Pandak |
| 5,129,788 | A | 7/1992 | Okayasu |
| 5,966,957 | A | 10/1999 | Malhammer et al. |
| 6,042,342 | A | 3/2000 | Orian |
| 6,123,512 | A * | 9/2000 | Benner ................ F04B 19/24 |
| | | | 417/209 |
| 6,820,684 | B1 | 11/2004 | Chu et al. |
| 7,263,848 | B2 | 9/2007 | Bhatti |
| 7,380,584 | B2 | 6/2008 | Ippoushi et al. |
| 7,503,176 | B2 | 3/2009 | Yatsuzuka et al. |
| 7,841,385 | B2 | 11/2010 | Campbell et al. |
| 7,971,449 | B2 | 7/2011 | Peterson et al. |
| 8,120,916 | B2 | 2/2012 | Schmidt et al. |
| 8,240,165 | B2 | 8/2012 | Novotny |
| 8,322,154 | B2 | 12/2012 | Campbell et al. |
| 8,419,378 | B2 | 4/2013 | Fenton et al. |
| 8,820,114 | B2 | 9/2014 | Charamko et al. |
| 9,069,532 | B2 | 6/2015 | Campbell et al. |
| 9,239,063 | B2 | 1/2016 | Fenton et al. |
| 9,285,129 | B2 | 3/2016 | Novotny et al. |
| 9,332,671 | B2 | 5/2016 | Schult et al. |
| 9,618,244 | B2 | 4/2017 | Blouberg et al. |
| 9,829,253 | B2 | 11/2017 | Mishkinis et al. |
| 9,869,274 | B2 | 1/2018 | Fuhrman |
| 10,041,708 | B2 | 8/2018 | Sedlak et al. |
| 10,369,863 | B2 | 8/2019 | Connell et al. |
| 10,436,521 | B2 | 10/2019 | Cho et al. |
| 10,605,501 | B2 | 3/2020 | Bangheri |
| 10,712,100 | B2 | 7/2020 | Adamson et al. |
| 10,724,772 | B2 | 7/2020 | Connell et al. |
| 10,746,440 | B2 | 8/2020 | Donovan et al. |
| 10,830,503 | B2 | 11/2020 | Kopko |
| 10,914,266 | B2 | 2/2021 | Rolandson |
| 10,948,241 | B2 | 3/2021 | Joshi |
| 10,962,304 | B2 | 3/2021 | Adamson et al. |
| 2009/0129946 | A1 | 5/2009 | Toubia et al. |
| 2012/0136954 | A1 | 5/2012 | Davis et al. |

FOREIGN PATENT DOCUMENTS

| | | |
|---|---|---|
| EP | 2927038 A1 | 10/2015 |
| GB | 303065 A1 | 5/1930 |
| GB | 1329567 A1 | 9/1973 |
| GB | 2015654 A1 | 9/1979 |
| KR | 1020120056521 A1 | 6/2012 |
| WO | WO2005035987 A3 | 4/2005 |
| WO | WO2005042981 A1 | 5/2005 |
| WO | WO2005121539 A1 | 12/2005 |
| WO | WO2012091816 A3 | 7/2012 |
| WO | WO2013149621 A1 | 10/2013 |
| WO | WO2020030933 A1 | 2/2020 |

OTHER PUBLICATIONS

Printout: Electric Cooling, "Thermal management and safety regulation of smart watches", https://www.electronics-cooling.com/2017/09/thermal-management-safety-regulation-of-smart-watches/, Sep. 11, 2017, 10 pages.
Printout: K.Heslin, "10 Data center trends to watch in 2020", https://facilityexecutive.com/2020/04/data-center-management-10-data-center-trends/, Apr. 22, 2020, 5 pages.
Printout: Data Center Cooling Market Growth, https://www.fortunebusinessinsights.com/industry-reports/data-center-cooling-market-growth/, Jan. 2020, 10 pages.
Wikipedia: "Einstein refrigerator", https://en.wikipedia.org/w/index.php?title=Einstein_refrigerator&oldid=973585763, Aug. 18, 2020, 3 pages.
Wikipedia: "Heat pipe", https://en.wikipedia.org/w/index.php?title=Heat_pipe&oldid=973161839, Aug. 15, 2020, 15 pages.
Wikipedia: "Immersion cooling", https://en.wikipedia.org/w/index.php"title=Immersion_cooling&oldid=1043510651", Sep. 10, 2021, 8 pages.
Wikipedia: "Injector", https://en.wikipedia.org/w/index.php?title=Injector&oldid=967631660, Jul. 14, 2021, 7 pages.
Wikipedia: "List of refrigerants", https://en.wikipedia.org/w/index.php?title=List_of_refrigerants&oldid=1035339680, Jul. 26, 2021, 17 pages.
Wikipedia: "Loop heat pipe", https://en.wikipedia.org/w/index.php?title=Loop_heat_pipe&oldid=952560728, Apr. 22, 2020, 3 pages.
Wikipedia: "Metal foam", https://en.wikipedia.org/w/index.php?title=Metal_foam&oldid=1044893829, Sep. 17, 2021, 13 pages.
Wikipedia: "Relief valve", https://en.wikipedia.org/w/index.php?title=Relief_valve&oldid=974509246, Aug. 23, 2020, 4 pages.
Wikipedia: "Safety valve", https://en.wikipedia.org/w/index.php?title=Safety_valve&oldid=957512538, May 19, 2020, 11 pages.
Wikipedia: "Thermal management (electronics)", https://en.wikipedia.org/w/index.php?title=Thermal_management_(electronics)&oldid=1038841962, Aug. 15, 2021, 11 pages.
Wikipedia: "Thermosiphon", https://en.wikipedia.org/w/index.php?title=Thermosiphon&oldid=960989907, Jun. 6, 2020, 4 pages.
Printout: "Capillary limit", Advanced Cooling Technologies, https://www.1-act.com/resources/heat-pipe-performance/capillary-limit/, Nov. 20, 2017, 5 pages.
Printout: "IGBT Cold Plates ATS-CP-1002", Advanced Thermal Solutions, Inc., Cold plates data sheet, Apr. 24, 2018, 2 pages.
Printout: "Closed loop liquid cooling for high power electronics", Advanced Thermal Solutions, Inc., Qpedia, vol. 1, Issue 9, Oct. 2007, 5 pages.
Printout: "Liquid cooling systems and their components", Qpedia Newsletter, Apr. 2009, 4 pages.
Article: James D. Van de Ven et al., "Liquid piston gas compression", Applied Energy, Jan. 6, 2009, 9 pages.
Printout: "Futuristic engine for the new hybrid cars: free piston linear alternator (FPLA)", Bright Hub Engineering, Oct. 8, 2001, 2 pages.
Printout: "Which pump should you use? D5 or DDC?", https://www.ekwb.com/blog/which-pump-should-you-use-d5-or-ddc/, Nov. 11, 2016, 6 pages.
Article: S. Langdon-Arms et al., "Development of a solar-powered liquid piston Stirling refrigerator", Energy Procedia, 142, 570-575, 9th Int'l Conference, ICAE2017, Aug. 21, 2017, 6 pages.
CN 102410187A, English translation, 12 pages, Year: 2012.
KR 20120056521A, English translation, 12 pages, Year: 2012.
Wikipedia: "Absorption refrigerator", https://en.wikipedia.org/w/index.php?title=Absorption_refrigerator&oldid=970309157, Jul. 30, 2020, 5 pages.
Wikipedia: "Check valve", https://en.wikipedia.org/w/index.php?title=Check_valve&oldid=973253068, Aug. 16, 2020, 7 pages.
Wikipedia: "Computer cooling", https://en.wikipedia.org/w/index.php?title=Computer_cooling&oldid=1045406650, Sep. 20, 2021, 23 pages.
Article: J.W. Mason et al., "Design and construction of a solar-powered fluidyne test bed", Proceedings of the ASME 2011 Mechanical Engineering Conference, Nov. 11, 2011, 12 pages.
Paper: T.M. Kuzay et al., "Enhanced heat transfer with metal wool filled tubes", Conference-910375-1, DE91 005831, (osti.gov 6329405), Aug. 1990, 32 pages.
Printout: MicroCool, 3000 series coldplates data sheet, www.microcooling.com, Mar. 15, 2016, 2 pages.
Printout: "Liquid cooling vs. air cooling: What you need to know", https://www.pcworld.com/article/2028293/liquid-cooling-vs-traditional-cooling-what-you-need-to-know.html, by David Murphy, Feb. 19, 2013, 2 pages.
Article: G. Dannen, "The Einstein-Szilard Refrigerators", Scientific American, Jan. 1997, 6 pages.
Printout: "Introduction to safety valves", Spirax Sarco, https://www.spiraxsarco.com/learn-about-steam/safety-valves/safety-valves, Sep. 1, 2020, 29 pages.

(56) References Cited

OTHER PUBLICATIONS

Printout: "Heat conducting 3D printing plastics", TCPoly, High performance plastic cold plates datasheet, www.tcpoly.com/products/coldplates, Sep. 10, 2019, 2 pages.

Article: James D. Van de Ven et al., "Developments towards a liquid piston Stirling Engine", American Institute of Aeronautics and Astronautics, Tracking# 132055, Paper #5635, Jun. 20, 2008, 9 pages.

Article: A.H. Zamanian et al., Identification and compensation of cogging and friction forces in tubular permanent magnet linear motors, Proceedings of the ASME 2017 Dynamic Systems and Control Conference, Oct. 11, 2017, 8 pages.

Article: B. Zohuri, "Basic principles of heat pipes and history", Heat Pipe Design and Technology, DOI 10.1007/978-3-319-29841-2_1, Apr. 2016, 41 pages.

Article: Jinwang Li et al., "Experimental study on evaporation-capillary pumping flow in capillary wick and working fluid system", Thermal Science, Jan. 2019, 12 pages.

\* cited by examiner

HEAT-ACTIVATED MULTIPHASE FLUID-OPERATED PUMP FOR ELECTRONICS WASTE HEAT REMOVAL

CROSS-REFERENCE TO RELATED APPLICATION

The present application claims priority under 35 U.S.C. 119(e) from U.S. Provisional Application 63/076,546, filed Sep. 10, 2020.

TECHNICAL FIELD

The present invention relates to fluid-operated heat activated pumping devices for the transport of heat, and especially those adapted for the removal of the waste heat generated by electronic devices, at the chip, board, rack, or datacenter level.

BACKGROUND ART

Electronics, microelectronics, and opto-electronic devices convert most of the power they consume into waste heat. The devices need to be maintained within a narrow operating temperature to ensure optimal performance and long-term reliability. If they run too hot, they will degrade faster. If they are cooled excessively, the amount of cooling infrastructure required can be prohibitively expensive.

Electronics cooling can be classified by the amount of heat being dissipated. For instance, data center level cooling is performed on the order of tens to thousands of kilowatts. Printed Circuit Board (PCBA) level cooling is on the order of tens to thousands of watts. Chip level cooling can be order of milliwatts to tens or hundreds of watts. Different cooling solutions are deployed at each level depending on the amount of heat dissipated and the geometric space available.

Demand for data center cooling is a growing global market driven by ever increasing data usage. A common metric for measuring data center cooling is the PUE (Power Usage Effectiveness). This is the ratio of the total power consumed and the actual power used by the IT equipment. A PUE of 1 means 100% of the power consumed was used by IT equipment. Common PUE values range from 1.11-3. That means cooling infrastructure roughly adds an additional 11-300% overhead to the data center. This additional overhead is in the form of air handling units, pumps, condensers etc.

There is clearly an economic and environmental benefit in making the PUE of datacenters as close to 1 as possible. However, there are several challenges involved in achieving this:

1. Air is a very poor heat conductor. In air-cooled data centers, the exhaust side air in a data center is at a relatively low temperature (28° C.-45° C.). Air at this temperature cannot be used for much heat recovery or for other processes directly. Often, the air must be heated to a higher, more useful temperature around 80° C. for use in other applications like residential/commercial hot water needs, laundry services, industrial kitchens etc. Significant infrastructure, investment and installation costs are incurred in performing the pre-heating. This in turns raises the PUE. While most data centers are still air cooled due to its convenience and low installation cost, with ever increasing heat densities, there is a push towards liquid cooled data centers.
2. Liquid cooling is much more efficient for heat transfer from the data center, even though it has a higher upfront cost due to the piping required. A key benefit of liquid cooling is that the waste heat is stored in higher fluid temperatures. This hot fluid is then used to perform useful work, and in some cases generate electricity. The efficiency of the process is still too low to justify the infrastructure investment required. Moreover, with liquid cooling, there is a need for efficient pumps to move the cooling fluid around and transfer the heat.

Within a datacenter, there are usually multiple racks of servers, networking, and other equipment. Within each rack are multiple PCBAs which house a number of electronics components (chips, memories, optical devices, power delivery devices etc.) interconnected together. Aside from datacenters, PCBAs are also used in other applications such as in automobiles, aircraft, wind turbines, transformers etc.

At the PCBA level, in non-hermetic applications, air flows from one end of the PCBA to the other, thus cooling the components on the PCBA. In hermetic applications, cooling is achieved by conduction to a cooler surface for subsequent convective and radiative heat dissipation. Current mainstream solutions rely on the following technologies to maintain stable operating temperatures, in increasing order of sophistication and cost:

1. Thermal Interface materials with very low thermal resistance to transfer heat from the transistors to heatsinks. These materials may be comprised of graphene, diamond composites, copper, carbon nanotubes etc.
2. Heatsinks made of high thermal conductivity materials (copper, aluminum, graphite etc.) to rapidly reject heat to the ambient air. Advanced manufacturing processes to ensure higher achievable surface area for maximum heat transfer.
3. Fans and blowers which drive large volumes of air at high pressure and velocity to enhance rapid convective heat transfer.
4. Passive cooling techniques like vapor chambers, heat pipes, loop heat pipes, oscillating heat pipes and thermosiphons which utilize cooling fluid heat of vaporization to rapidly transfer heat from the hot surface to a cooler heatsinking surface. The condenser liquid returns to the evaporator by capillary forces in wick structure or gravity. The cooling capability of heat pipes and loop heat pipes is limited by the capillary limit of the wick structure that moves the liquid back from the condenser to the evaporator.
5. Active cooling techniques like pumped liquid cooling, 2 phase jet impingement cooling and immersion cooling. The cooling capability of pumped liquid cooling is limited by the size and robustness of the pump. 2 phase jet impingement requires a vaporized jet to directly cool the heat source at high velocity, driven by an active pump. The cooling capability of immersion cooling is limited by the size of the cooling enclosure and robustness of the water and immersion oil pumps.

Pros and cons of passive and active cooling techniques (4 and 5) are:

| Cooling Techniques | Pros | Cons |
| --- | --- | --- |
| Passive Cooling (Loop Heat Pipes, Heat Pipes, Vapor Chamber, Thermo-siphon) | 1. Requires no active pumps 2. Easier to incorporate in space constrained enclosures 3. High reliability | 1. Power dissipation capability limited by capillary limit 2. Require large surface area for heat transfer to ambient air |

-continued

| Cooling Techniques | Pros | Cons |
|---|---|---|
| Active Cooling (Pumped Liquid Cooling) | 1. High power dissipation capability 2. Versatile, can be used to cool any devices and ensure controlled operating temperature | 1. Requires pumps (two for redundancy) 2. Requires more board space for pumps, piping, and connectors 3. Low reliability due to pumps 4. High power consumption to operate pumps 5. Risk of leaks, contamination 6. Difficulty replacing field failures 7. Higher cost |
| Active Cooling (Immersion Cooling and/or Jet Impingement Cooling) | 1. Compact 2. Reduced overall infrastructure (no fans, heatsinks etc.) 3. Effective cooling | 1. Expensive 2. Requires managing fluids and leaks in field operating conditions 3. Not all components can be effectively immersed/jet cooling in cooling fluid - requires significant technology investment, infrastructure, and standards 4. Requires expensive pumps to operate - field reliability issues and capital investment/maintenance issues |

A device mounted downstream from another device must be cooled even more to account for the warmer air exiting from the upstream chip. This "shadowing" effect is quite prevalent in most PCBAs because the airflow is unidirectional across the entire board. Generally, the higher heat dissipating devices are placed closer to the front, where cooler air is entering. Consequently, other devices like power supplies downstream have a lower temperature margin and must contend with warmer incoming air while maintaining their temperature below a target limit. To ensure these downstream components remain functional, the fans, heatsinks, airflow etc. need to be increased at entry, which adds more cost, complexity, and inefficiency to the cooling solutions.

A challenge with conventional PCBA level cooling techniques, like heatsinks, heat pipes and vapor chambers, is that they are designed to operate at constant (worst case) power dissipation and ambient temperature conditions upfront during the design process. While cooling fans can be variable speed; that is only helpful within a narrow range and fan speed control is a very coarse tool: if even one device is running hot, the fans will run faster to keep that device cool but will also inevitably cool the other devices that don't require the additional cooling. For instance, a heatsink is designed upfront to operate at 55° C. ambient temperature and the highest expected power dissipation of the chips. So even if the ambient temperature is 27° C. and the actual power dissipation of the chip is 10% lower than expected, the heatsink or heat pipe cannot be resized dynamically to account for the lower actual thermal cooling needs. This makes electronic systems bulkier and more expensive because they are designed to fit the worst-case environment.

Another challenge with conventional PCBA level cooling is that there is little ability to "tune" the device temperature to optimize field reliability. Newer silicon technologies make devices very sensitive to operating temperature and reliability. If the target lifetime of the device is 10 years and it has been used in a relatively benign environment where most of its lifetime is not yet consumed; the device could be operated at a higher duty cycle (above its recommended temperature) so that more of its useful life can be consumed. Conversely, if a device has been used in an excessively harsh environment, it could be run at a lower temperature, so it lasts closer to its target lifetime. Such "tuning" of device reliability is not possible to achieve with the current conventional cooling solutions.

In some high-performance applications, conventional pumped liquid cooling can be used to cool PCBAs. However, these liquid cooling solutions require dynamic pump control (sensors, controller circuitry etc.) to maintain pump speed. This in turn adds more cost, overhead, reliability and operational risk and real estate to the PCBA cooling solution.

Another key shortcoming of current PCBA level cooling solutions is that all the heat dissipated from the electronic devices is simply transferred to the ambient air or cooling liquid. None of the dissipated heat is actually used to do any useful work, not even work to actually cool the devices in the first place. For instance, assume a PCBA has five (5) devices, each device dissipating 500 W (total board heat dissipation is 2500 W). A conventional liquid cooling system would require 10 W per device to operate a cooling pump (total pumping power of 50 W required). If even 0.1% of the heat dissipated is converted into useful work (e.g., to pump cooling fluid around), the overall heat dissipated will be reduced from 2550 W to 2547 W (a 1.9% reduction). Scaling this to hundreds or even thousands of boards used across multiple products, the savings can be tremendous.

Going deeper from the PCBA to the silicon chips, the closer the cooling solutions get to the heat source itself, the more efficient they can be. At the chip level, electronics cooling is facing several challenges:
1. With exponentially growing computation needs, the number of transistors in a chip has been doubling every 18 months. This increases the power density of the chips that need to be cooled.
2. With each new silicon technology, as transistors are packed closer together (for faster performance), there is increasing "leakage" of current across transistors: parasitic losses. To compensate for these parasitic losses, the devices require even more power to run, which results in even higher heat dissipation.
3. In addition, with each new silicon technology, since the transistor feature size is reduced, the tolerance to prolonged high temperature operation is reduced. This means that advanced logic chips cannot operate at high temperatures (>105° C.-250° C.) for long periods of time without failing prematurely.
4. Logic chips need to be placed as close as possible to each other and to memory and optical devices, to reduce delay and operate at faster speed. However, memory and optical devices are particularly sensitive to temperature and cannot operate at very high temperature. Some memory devices are limited to less than 95° C. operating temperature whereas some optical devices are limited to 70° C. operating temperature. Since they are placed so close to each other, cross-heating from a logic chip to a memory chip needs to be minimized to avoid overheating the memory and/or optical devices.

Conventional chip level cooling solutions vary depending on the amount of heat to be dissipated. Pumped direct liquid cooling through chip microchannels, two phase jet impingement cooling or immersion-cooling are used in applications where the heat dissipation is on the order of hundreds to thousands of watts. These solutions rely on connectivity to the larger system to enable the circulation of fluid in and out of the chip and off-chip fluid cooling.

Low wattage devices (on the order of 0.1 milliwatts to tens or a few hundreds of watts) require specific cooling solutions especially if they are in a constrained space. Smartphones are becoming more sophisticated and power hungry. Smartphone capability is limited by power consumption and heat loss. More computation capability means more power consumption, which means more heat generation and larger battery size.

Heat from smartphones is dissipated by conductive heat transfer from the transistors through the phone body to the surrounding atmosphere, human skin etc. Due to space limitations, there are no active cooling devices like fans or pumps to remove the heat faster. In some advanced smartphones, miniature heat pipes/vapor chambers are used to speed up the heat transfer from the transistors to the smartphone chassis. Heat pipe fluid return capability is limited by the amount of pumping power the capillary wicks can provide. This capillary return capability is both space and material limited. A miniature wick structure can only pump so much fluid even in best case conditions. While heat pipes are somewhat more effective than thermal interface materials, there is still a need for better heat dissipation without consuming too much space. There is a need to use active cooling techniques (like pumped liquid cooling) to speed up the heat transfer without significantly changing the size, thickness, cost, or reliability of the smartphone device.

Wearable devices (fitness monitors, watches etc.) have the same, if not even more critical, challenges of power consumption, size, cost, and battery power as smartphones. With such limited space and close contact with human skin, there is even greater need for better cooling of electronics in a small space. A typical smartwatch is expected to last at least 15 hours with a 2200 mAh battery. Operating at 1.1V, that translates to 2.42 Wh. This energy is mostly converted into heat and dissipated from the battery chassis to ambient air and human skin. Human skin is very sensitive to high temperature and a typical chip in the smartwatch can run as high at 40° C. This limits the capability of the wearable device. Current efforts are focused on using advanced thermal interface materials (graphite etc.), heat pipes, vapor chambers etc. to enhance heat transfer. These techniques are passive solutions which have limited effectiveness for temperature control and heat transfer.

Due to limited power availability, there is also a need to recapture the heat lost so it can be used to power the device rather than being dissipated/wasted into the environment. Even a small amount of energy recapture can help prolong the operating time of the device or reduce the size or cost of the battery. Efforts have been made in the past to use thermoelectric generators that utilize the difference in temperature between the device and human skin to generate electricity. However, this approach has been shown to be insufficient to generate enough useful energy to justify the space consumed by the thermoelectric generator and the cost involved.

There is a need for a scalable solution that can be deployed at the system level (e.g., datacenter), PCBA and chip level to address several of these issues and be cost effective and reliable.

SUMMARY DISCLOSURE

A heat activated pump is provided for the removal of waste heat from one or more electronics components, either at the chip, board, rack, or datacenter level. An evaporator contains a working fluid and is directly coupled against one or more electronics components to receive external heat therefrom to convert the working fluid into vapor. A pressure-control valve is coupled to an exit port of the evaporator, maintains the working fluid in the evaporator at a set target pressure and allows vaporized working fluid to escape through the exit port whenever the target pressure is exceeded. A liquid-piston chamber coupled to the pressure-control valve receives the vaporized working fluid from the evaporator at the target pressure. The vaporized working fluid expands adiabatically and displaces liquid within the liquid-piston chamber, expelling it therefrom in a pumping stage of a thermodynamic cycle. A unidirectional pump-exit check valve is coupled to an exit port of the liquid-piston chamber to allow the displaced liquid to exit the liquid-piston chamber. A unidirectional liquid suction-entry check valve is coupled to a return port of the liquid-piston chamber. A condenser with a heatsink is coupled to the pump-exit and suction-entry check valves to receive displaced liquid and allow it to return to the liquid-piston chamber in a suction stage of the thermodynamic cycle. The heatsink radiates heat away to a flow of cooler air. Finally, a unidirectional vapor-injector return check valve is coupled to both an exit port of the liquid-piston chamber and to an input port of the evaporator. Periodic pressure pulses from the liquid-piston chamber that temporarily exceed the pressure in the evaporator facilitate jets of condensed working fluid to return to the evaporator in successive brief spurts.

The solution presented with this heat-activated multiphase fluid-operated pump technique for electronics cooling provides all the benefits of liquid cooling without some of the challenges of conventional pumps, piping and connectors involved in liquid cooling:

1. High power dissipation capability—the same as with active liquid cooling and even higher if a refrigerant based working fluid is used instead of water/glycol.
2. Versatile—it can be used to cool any device and ensure controlled operating temperature.
3. Flexibility in component placement on a board —because it can be incorporated in any geometry upfront in the design process.
4. No electrical pumps are required. Thus, no additional electricity consumption to drive the pumps.
5. Much less board space is lost to accommodate electrical pumps.
6. High reliability—due to the absence of electrical pumps.
7. Minimal risk of leaks—no more than that with heat pipes, vapor chambers or thermo-siphons, which are commonly used in all applications.
8. Easy to replace in field operation—can be replaced just as heatsinks can be replaced.
9. Much lower cost due to simpler design and less key working elements.
10. Less heat lost to the atmosphere as some of the heat is used to drive the pumping. This is in strict contrast to electrical pumps which actually consume more electricity to cool the chips. For instance, if a typical 1000 W chip could require a 10-watt pump to be kept cool. If redundant pumps are used, 20 watts. With heat activated pump of the present invention, the 20 watts of electrical pumping power would not be required.

In terms of operating conditions, the present heat activated pump solution sits between the two extremes of active and passive cooling solutions. It uses vapor, not liquid, pressure to drive the pumping.

DETAILED DESCRIPTION

Nomenclature

Working Fluid: The fluid whose change in phase is utilized to performing the pumping operation. The working fluid could be selected from a variety of fluid options: water, as well as commonly used or new refrigerants (e.g., R-130, R-245fa, R-407c, R-410a, R-454b, R-1234yf, etc.). In addition to performance and desired temperature range, safety (flammability and exposure limits) will be factors in the choice of working fluid.

Figure 1:
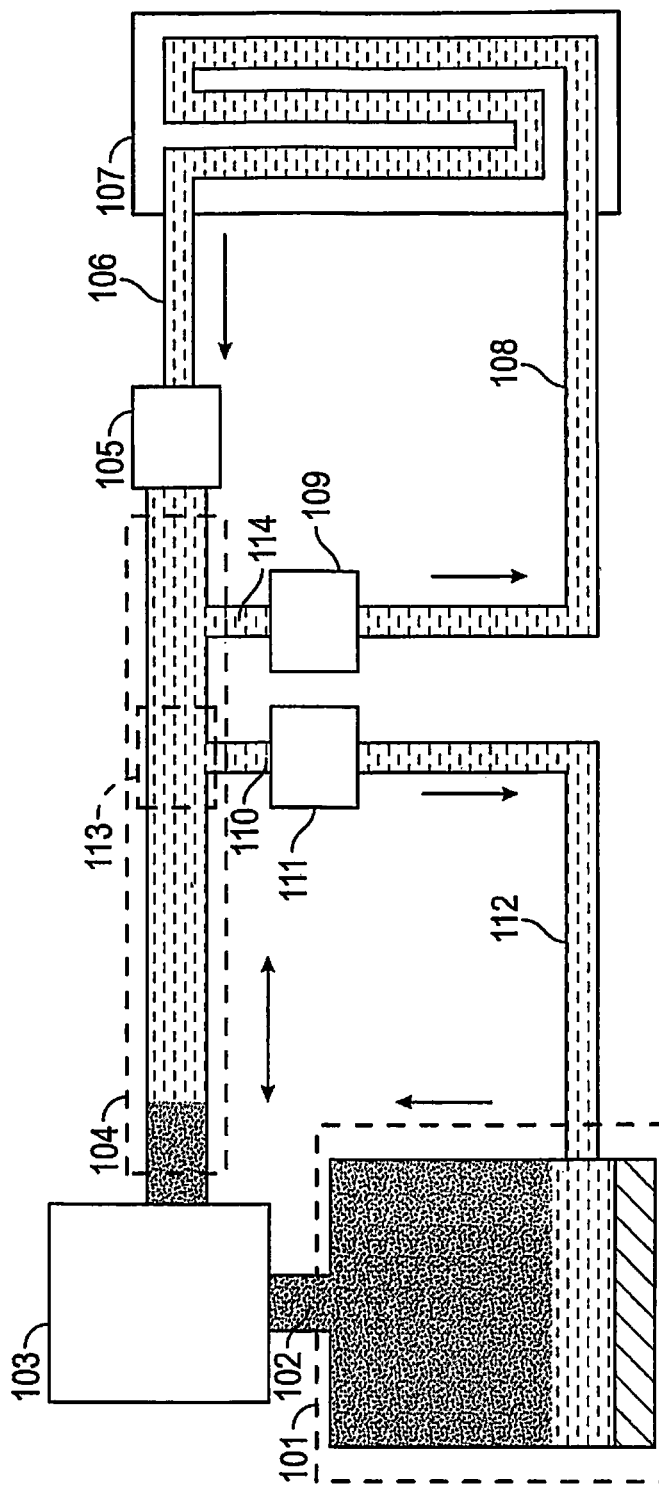
FIG. 1 is a schematic plan view of a heat-driven fluid-operated pump in accord with the present invention for providing a heat activated pump for electronics cooling.

Pumped Fluid: The fluid which needs to be pumped from one location to another. This could be the same as the working fluid or it could be a different fluid material altogether. If the pumped fluid is different, it would need to be immiscible with the working fluid. In that case, a separator 113 may be provided (as seen in FIG. 1) at the return port 110 of the liquid-piston chamber 104 to direct only the working fluid material, and not the pumped fluid material, back to the evaporator(s) 101.

Ambient Temperature: The temperature in the general environment around the region or device in focus.

The Heat-Activated Multiphase Fluid-Operated Pump

The HAMFOP pump utilizes heat to pump a fluid. The heat is used to convert a working fluid from liquid to vapor. The vapor is then used to displace the fluid that needs to be pumped.

The principle of operation is as follows, as referenced by the numbered elements in FIG. 1, assuming that both the working fluid and the pumped fluid are the same:

1. Heat is applied to the hot chamber or evaporator 101, which contains a small quantity of the working fluid in liquid form. As it is heated, the working fluid is transformed into vapor 102 at a high pressure based on the amount of heat applied and temperature and sizing of the hot chamber 101.
2. The pressurized vapor pushes against the base of the pressure control valve 103, which is counteracted by a deadweight or equivalent load applied on top of it. Once the pressure of the vapor 102 exceeds the deadweight load, the valve 103 opens and the vapor 102 enters a piston/suction chamber 104, which has a larger area. The larger area ensures that the force applied by the vapor 102 remains high enough to keep the valve 103 open until a desired amount of the vapor 102 exits the hot chamber 101. This operation is similar to the principle of operation of a typical safety valve.
3. When the vapor 102 enters the piston/suction chamber 104, which already contains the fluid 114 that needs to be pumped, the high-pressure vapor 102 rapidly expands and displaces the pump fluid 114 from the entry side of the piston chamber 104 towards an exit side (on the right in FIG. 1).
4. The rapid adiabatic expansion of the vapor 102 induces a periodic pressure pulse that flows through the pumped fluid 114 in the piston chamber 104. Since the pumped fluid 114 is incompressible, this temporarily raises the pressure in the piston chamber 104, while the pressure in the hot chamber 101 temporarily decreases due to the loss of the vapor 102. This creates a positive pressure differential between the piston chamber 104 and the hot chamber 101, which results in the opening of a return valve 111. Due to the pressure pulse generated by the rapid entry of the vapor 102 and the incompressibility of the pumped fluid 114, the pressure in the piston chamber 104 transiently rises to a value above the vapor entry pressure. The increased pressure in the piston chamber 104 causes the return valve 111 to open (acting like an injector). Some of the pumped working fluid 110 flows through the return valve 111 and enters via a replenishment passageway 112 back into the hot chamber 101 for re-heating. Once enough working fluid 110 has flowed into the hot chamber 101 to equilibrate the pressure, the return valve 111 closes. This operation is similar to the function that an injector performs in steam engines: high-pressure vapor is used to push a fluid into a high pressure and high temperature evaporator. In the optional case where the pumped fluid 114 displaced by the working fluid (originally vapor 102, but now again in liquid form after the adiabatic expansion) are different materials that are immiscible, a separator 113 will be provided at the return port 110 of the piston chamber 104 to separate the working fluid from the pump fluid (now both liquids). The construction of separators of immiscible liquids is known. The key is to only allow the working fluid material to return to the hot chamber or evaporator 101, keeping out the different pumped fluid material. If the working and pumped fluids are identical materials, then the separator 113 is not needed.
5. Since the piston chamber 104 now has slightly less fluid, the working vapor 102 continues to expand adiabatically and push against the pumped fluid 114. As the pressure in the piston chamber 104 continues to remain high, the pump exit valve 109 opens and lets out the fluid 114 via a passageway 108 into the condenser 107. This continues until the fluid 114 has been evacuated from the piston chamber 104 and the pressure in the piston chamber 104 reduces to a pressure close to that in the condenser 107.
6. Upon displacing the pumped fluid 114, the vapor 102 remaining in the piston chamber 104 expands into a larger volume, so it condenses, resulting in a reduction in pressure in the piston chamber 104, to a value below the pressure in the condenser 107. As a result, the pump valve 109 closes, completing the pump portion of the cycle and beginning a suction phase. The suction valve 105 now opens due to the negative differential pressure between the condenser 107 and the piston chamber 104, letting fresh working fluid 106 in. Due to the negative differential pressure, fluid 106 is drawn into the piston chamber 104 from the condenser 107.
7. While the pressure in the piston chamber 104 is below that of the condenser 107, the pressure control valve 103 remains closed to ensure no new vapor 102 enters the piston chamber 104 until the piston chamber pressure returns to above the condenser pressure, concluding the suction phase of the cycle.
8. Once the fluid in the piston chamber 104 has been replenished and the pressure is raised to the pressure of the condenser 107, the pressure control valve 103 re-opens, letting in vapor 102 to repeat the cycle.
9. In some embodiments, an electricity generator module may generate an electrical current induced in winding coils around the piston chamber during the continuous cyclic operation of the pump.

In the case where the pumped fluid 114 (and 106) is composed of a different material from the working fluid 102 (and 110), and not merely a different liquid-vapor phase of the same material, a difference in density between the working and pumped fluids can be leveraged to separate them. The elements of such an embodiment are largely identical to structure and operation to those in FIG. 1, except for the addition of a separator, in which the pumped fluid and the working fluid are separated. The pumped fluid 114 and 106 being of lower density would float to the top while the working fluid 102 and 110 would sink to the bottom. Accurate tuning (balancing the precise quantity of working and pumped fluid) would need to be performed to ensure that the separator chamber never ends up without any working fluid at all. If that were to happen, then some of the pumped fluid could enter the hot chamber 101, thus interrupting the cycle.

Figure 2:
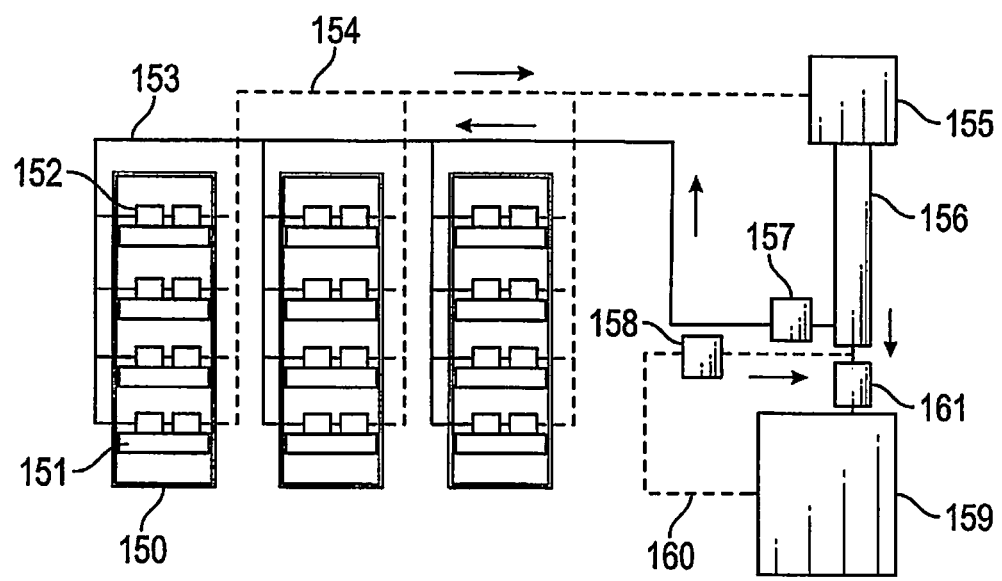
FIG. 2 is a schematic view of a datacenter cooling arrangement using fluid-operated heat activated pumps in accord with the present invention.

Heat Activated Pump for Cooling of Large Systems Such as Racks of PCBAs, Datacenters and Other Such Large Electronic Systems A heat activated pump system can be used to move fluid around a datacenter as illustrated in FIG. 2, in which multiple heat activated pump units are interconnected together.

Heat activated pumps on devices attached to PCBAs in a rack pump the cooling fluid around in piping running throughout the data center. The datacenter-level heat activated pump system uses this hot pumped fluid from each individual heat activated pump to pump the fluid to the condenser and return the fluid back to the PCBA level devices at a cool temperature to close the circuit as shown in FIG. 2. Individual heat activated pumps 152 are mounted on circuit boards 151 positioned in racks 150. Details of the individual heat activated pumps 152 are as referenced in FIG. 3. Evaporator lines 154 from groups of chips, boards, and racks connect through one or more pressure control valves 155 to one or more associated piston-suction chambers 156. Groupings may encompass an entire datacenter or various subsets of a data center, each grouping having a condenser 159. The piston-suction chamber(s) 156 have a corresponding working fluid return valve 157 coupled to working fluid return lines 153 leading back to the grouping of chips, boards, and racks. Each piston-suction chamber 156 also has a pump valve 161 coupled to a condenser 159, with a suction return line 160 back to the chamber 156 via a suction valve 158. Each grouping operates as described above with reference to FIG. 1.

Heat Activated Pump for Cooling of Electronic Devices Mounted on PCBAs

Figure 3:
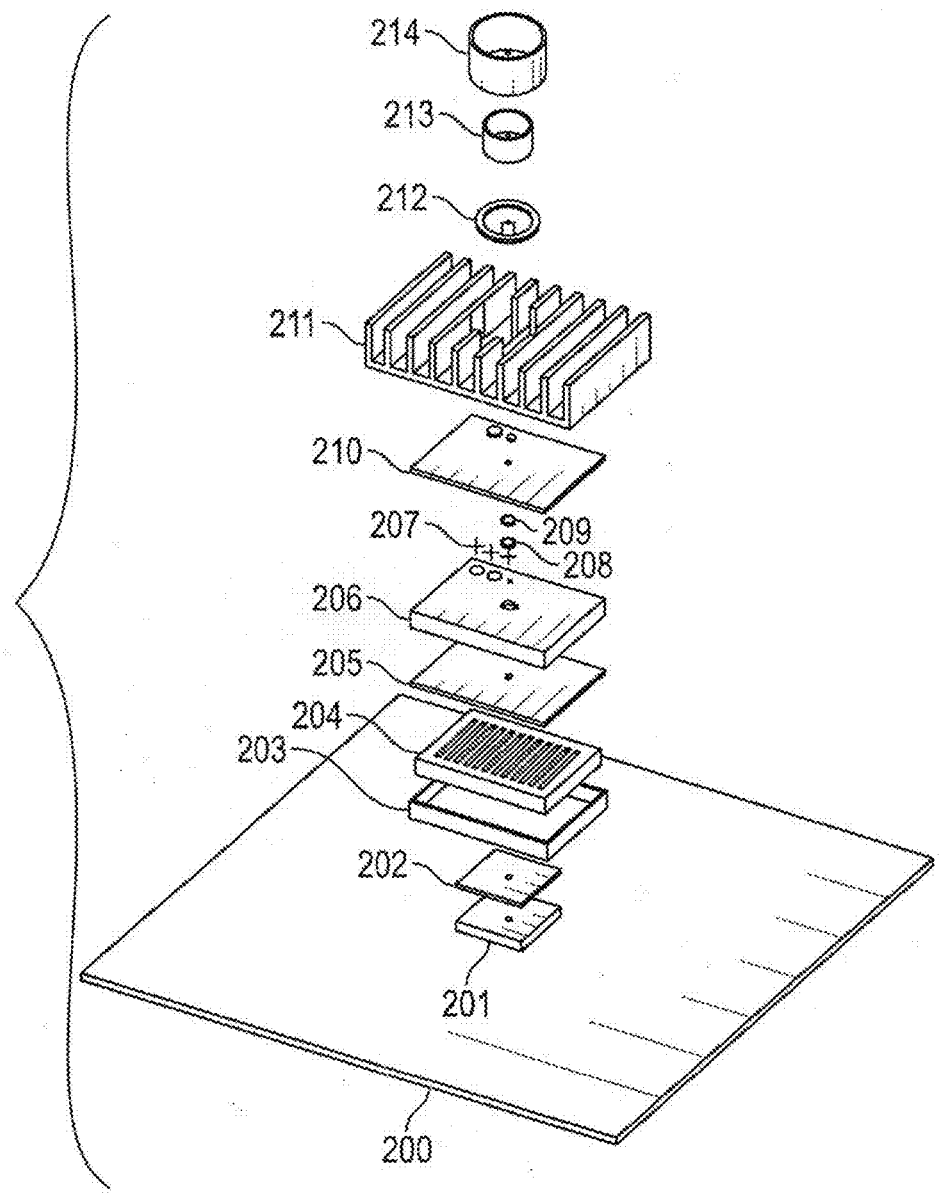
FIG. 3 is a perspective view of a heat activated pump as in FIG. 1 for cooling of individual electronic chip components.

As seen especially in FIG. 3, key heat activated pump elements for device cooling on PCBAs are:

| Element | Material Options | Description |
| --- | --- | --- |
| Printed Circuit Board 200 | Standard Industry Materials | The board on which different electrical devices are mounted |
| Chip 201 | Standard Industry Materials | Generic designator for the device that needs to be cooled. It could be a logic chip, memory, optical device etc. It could be a single monolith or a heterogeneous multichip device. |
| Thermal Interface Material (TIM) 202 | Standard Industry Materials | A thin material used to contact two heat transferring surfaces. The fluid-operated heat activated pump could be bonded directly to the chip or contacted via the TIM material |
| Evaporator Enclosure 203 | High Thermal Conductivity: Copper, Aluminum, High Temp Ceramic etc. | The outer body of the evaporator. This could be standalone if a metal foam is inserted into the enclosure. It could be integrated with the core |
| Evaporator Core 204 | High Thermal Conductivity: Copper, Aluminum, High Temp Ceramic, Metal Foam etc. | The core is where the working vapor is created. It is designed to have the highest surface area possible for max heat transfer. Core examples: metal foam, serpentine grooved trenches, or bonded fins |
| Evaporator Top Cover 205 | High Thermal Conductivity: Copper, Aluminum, High Temp Ceramic etc. Could be bolted, soldered, or welded to evaporator and pump | Plate to allow vapor to exit the evaporator and return to it. Comprised of holes strategically located to allow vapor exit and liquid return |
| Pump 206 | Insulating material: PTFE, Nylon, Plastic, or other material coated with insulation | Vapor from evaporator enters the pump, flows through the channel displacing existing fluid. Vapor condenses in the channel while displacing the fluid and evacuating the channel, thus creating a low-pressure cavity for fresh fluid to be sucked in. Contains three valves integrated into it: pump fluid out, return some fluid back to evaporator and suck fresh fluid in |
| Valve Balls 207 | Plastic, Metal (Steel, | Balls (could also be thin discs) designed to allow |

-continued

| Element | Material Options | Description |
|---|---|---|
| | Tungsten etc.), Rubber, Ceramic | only unidirectional flow as desired. O-rings could also be used with the balls to ensure tight seals |
| Pressure Valve Gasket 208 | High Temp, Fluid Vapor Resistant (e.g., Silicone) | Thin, flexible gasket designed to seal the vapor entry into pump |
| Pressure Valve Seat 209 | Copper, Aluminum, High Temp Ceramic, or high temp plastic etc. | Shaft designed to apply solid pressure on valve gasket, so the vapor does not enter the pump chamber until the pressure exceeds target load value. |
| Diaphragm 210 | Silicone, Rubber, or other flexible material that can withstand working vapor pressure, chemical and temperature conditions | Diaphragm designed to flex to allow vapor to escape into second chamber when pressure exceeds target load. Diaphragm can be replaced with O-rings or metal bellows in other embodiments as needed |
| Condenser 211 | High Thermal Conductivity: Copper, Aluminum, High Temp Ceramic etc. Could be bolted, soldered, or welded to pump | Pumped hot liquid flows from the pump to the condenser. Condenser has serpentine channels to move fluid and exchange heat with heatsink attached on top of it. Condensed fluid then returns to the pump chamber through the suction valve. Condenser could also send fluid to another secondary condenser for more cooling |
| Heatsink 211 (combined with condenser) | High Thermal Conductivity: Copper, Aluminum, High Temp Ceramic etc. | Heat from the condenser is transferred to the heatsink by conduction. Fins on the heatsink accelerate heat transfer to flowing air. In another embodiment, the heatsink could be more tightly integrated into the condenser like a conventional radiator. Different heatsink fins could be used: wavy, elliptical, slotted etc. The heatsink can be mechanically clamped/bolted down to the PCB to ensure it remains firmly in place over the chip. A backing plate underneath the PCB ensures the board remains supported and the chip is not excessively loaded in-situ or during assembly. Whenever needed, the entire assembly can simply be removed and replaced |
| Load Seat 212 | Metal or plastic - high rigidity | The seat applies a mechanical advantage by balancing the force of the load on top of it with the vapor counter-pressure from the valve seat. Grooves on the top surface keep the load centered on the load seat. |
| Load 213 | High density material: Tungsten, Liquid Gallium etc. | The target weight that the vapor needs to overcome to open the valve. The load could be a dead weight or a compression spring that could be deflected to impart the same target load resistance. |
| Load Cover 214 | Rigid sheet metal or plastic, preferably heat insulating. Could be bolted, welded, or soldered on to the heatsink body | Designed to hold the load in place and prevent it from falling off. Also designed to provide a "back-stop" to ensure that the load does not displace excessively due to vapor pressure in case the diaphragm fails. |

This specific embodiment is for a chip and board horizontally oriented with the heat activated pump mounted on top of the chip. This design can easily be modified to operate with a chip and board vertically oriented as well. In situations where multiple chips are mounted close together (as in chiplets on a single substrate) and some of the chips have lower operating temperature requirements as compared to others (as in memories and logic devices); then their heat paths can be completely separated into two distinct pumps operating independently. The vapor pressure of each pump can be tuned to match the target operating temperature of each chip to be cooled. This way, cross heating is mitigated, and each chip operates close to its own target temperature.

Evaporator

Figure 4:
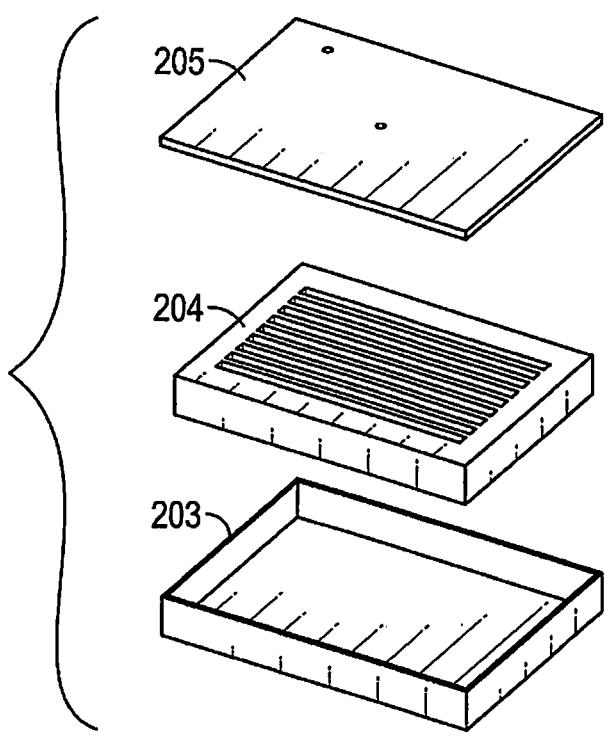
FIG. 4 is a close-up of the evaporator portion of the heat activated pump of FIG. 3.

The details of the evaporator are outlined in FIG. 4. It is comprised of three key elements:

1. An enclosure 203 that holds the evaporator core 204 and facilitates the transfer of heat from an external heat source to the evaporator core 204. The region of the enclosure 203 exposed to the heat source needs to be designed to be very high thermal conductivity and low thermal resistance. The rest of the evaporator enclosure 204 is insulated to prevent heat loss.

2. An evaporator core 204, in which the working fluid is converted from liquid to vapor or maintained in vapor form. The key design features of the core 204 are very high surface area to enable effective heat transfer to the liquid. Some embodiments of the core include but are not limited to:
   a. Metal Foam: porous metallic structures designed to have very high surface area and high heat transfer.
   b. Metal Mesh/Wool/Screen: high thermal conductivity metal mesh can be used as an effective core. Copper, Aluminum, or other metal mesh structures can be brazed or soldered to the evaporator enclosure to achieve the desired high heat transfer area.
   c. Serpentine Trench: a metal trench can be machined or stamped into the enclosure to allow the working fluid to move from entry to exit. Using a single directional serpentine trench requires less of the fluid and ensures that most of the heat is used for phase change rather than simply heating the liquid. The trenches can be filled with metal mesh/wool to further enhance heat transfer.

d. Cold plates: microchannel or tubular cold plates can be used.

3. Top cover plate 205: this is designed to keep the enclosure 204 sealed and allow exit of the vapor and entry of the liquid. The plate 205 could be welded, bolted, brazed, soldered etc. to the evaporator or be an integrated part of the evaporator body itself.

Pressure Control Valve

Figure 5:
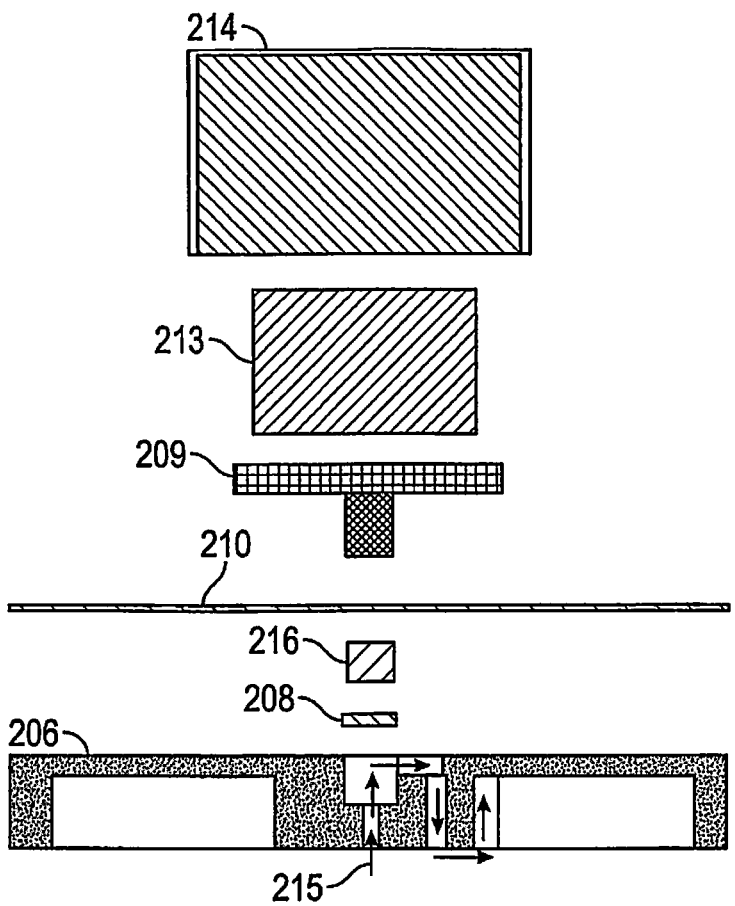
FIGS. 5 and 6 are respective exploded and assembled side sectional views of the heat activated pump body and pressure control valve assembly of the heat activated pump of FIG. 3.
Figure 6:
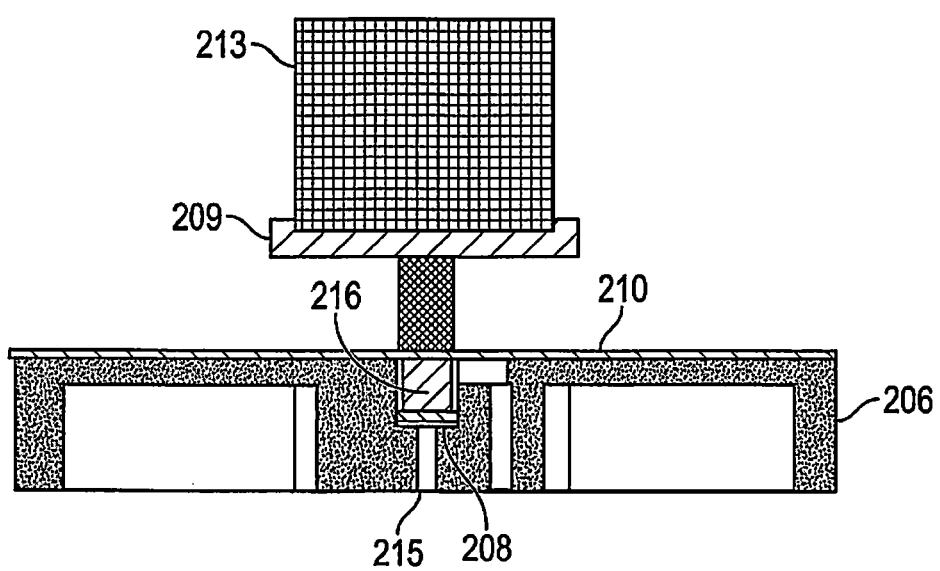

The details of the pressure control valve are outlined in FIGS. 5 and 6. It is comprised of these key elements:
1. A gasket 208 that seals the vapor in the evaporator 203, 204 and 205. In very precisely machined structures, the gasket 208 can be dispensed with, and pure solid-solid pressure could be relied upon.
2. A valve shaft 216 that transmits the load from the counterweight 213 to the gasket 208 to keep the pressure below a set value as determined by the weight of the counterweight load 213.
3. A larger second cavity in which the valve shaft 216 sits, which ensures that a force applied by the vapor is still high enough to keep the seal open as the vapor exits the evaporator into the piston.
4. A diaphragm 210 that deflects when the vapor pressure exceeds the counterweight load 213. The diaphragm 210 also prevents the vapor from leaking out of the valve.
5. A load seat 209 that applies a mechanical advantage: one end has a small area and the other has a much larger area to accommodate the larger load 213. The seat 209 also has a cavity in it to hold the load 213 in place.
6. A load 213 that could be a dead-weight or a liquid that keep the valve closed at a set pressure. The load 213 could also be a spring-loaded structure to achieve the same end objective: an applied force.
7. A load cover 214 that encases the dead weight load 213 and holds it all in place. A small hole can be made in the cover to ensure that the air around the dead-weight load 213 always remains constant (atmospheric).

Piston Chamber

Figure 7A:
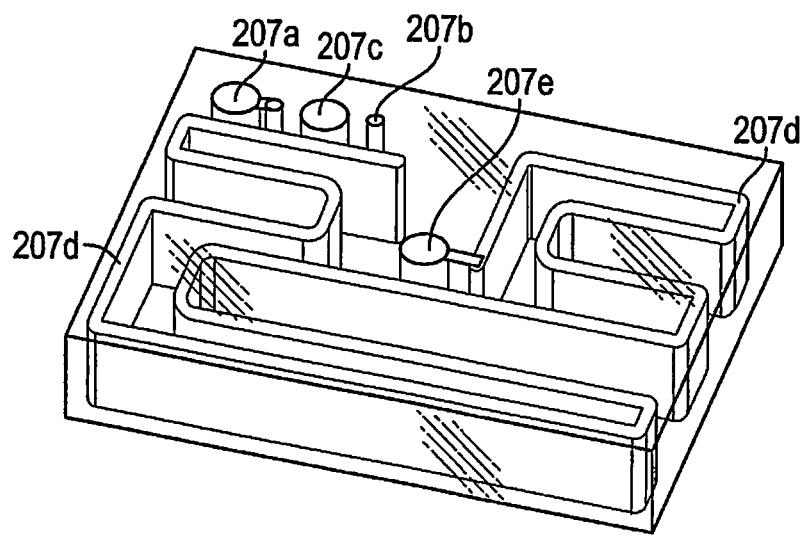
FIGS. 7A-7C are respective perspective, top exterior, and side sectional views of the heat activated pump body of the heat activated pump of FIG. 3 with special focus upon the various pump valves of the piston-suction chamber.
Figure 7B:
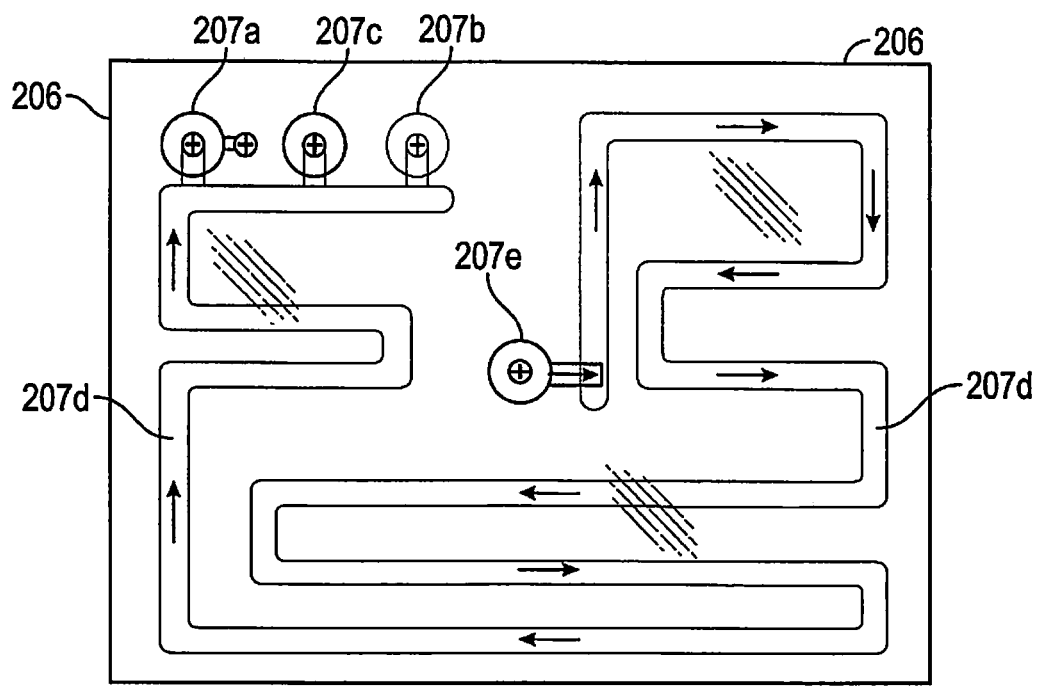
Figure 7C:
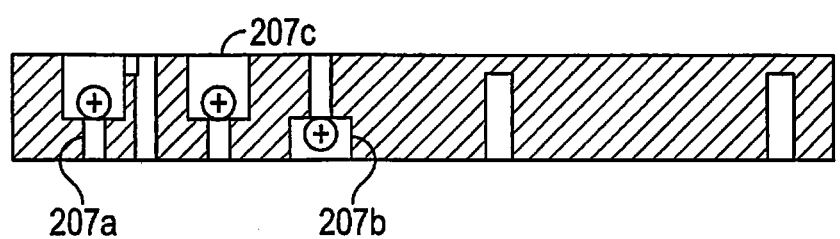

The details of the piston are outlined in FIGS. 7A-7C. It is comprised of these key elements:
1. The encasing body 206 (seen in FIG. 3) that holds the chamber in place and houses the different valves 207a-207c. The body 206 needs to be insulated to prevent losses and pre-heat the incoming fluid to improve pumping output.
2. A piston chamber 207d in which the vapor expands and pushes out the pumped fluid. A key benefit of a liquid piston is that infinite potential shapes can be used to make the design compact, space efficient and versatile.
3. The chamber walls of the piston-suction chamber 207d need to be smooth and can be coated with fluid repelling coating to reduce friction losses. The curves in the structure need to be smooth to prevent localized sudden area increases which may cause the vapor to condense prematurely.

Valves

The details of the valves 207a-207c are outlined in FIG. 7C. For compactness, the valves are embedded in the body 206 of the piston pump chamber. This is just one example of the implementation of the valves, they could be implemented in infinite possible geometries and commercially available check valves could also be used. While the image shows the valves only actuated with balls 207e, the balls could be augmented with O-rings, discs, or gaskets depending on the quality of the metrological finish. The valves are actuated by the differential pressure across them.

Condenser

The details of the condenser and heatsink 211 are outlined in FIG. 3. In this embodiment, the condenser and heatsink 211 are shown as bonded to each other horizontally. Alternatively, the condenser and heatsink could also be in the form of a radiator/condenser, placed remotely from the pump depending on the space available and the access to cooling air. The fluid channels in the condenser could also be structured in infinite possible geometries similar to the piston-suction chamber 207d in FIGS. 7A-7C.

Multiple Chips on PCBA Implementation

Figure 8:
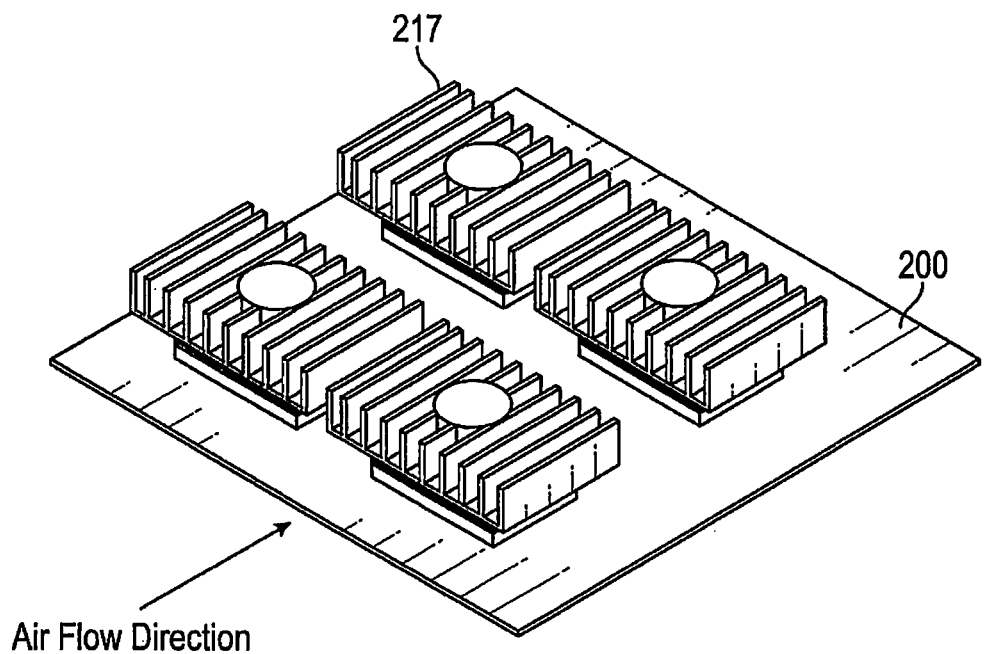
FIGS. 8 and 9 are perspective views of two embodiments of heat activated pump cooling constructions for use with multi-chip circuit boards.

The aforementioned implementations are for cooling only one individual electronics device on a PCBA 200. When multiple devices 217 are mounted on a PCBA 200, an example arrangement is shown in FIG. 8.

Figure 9:
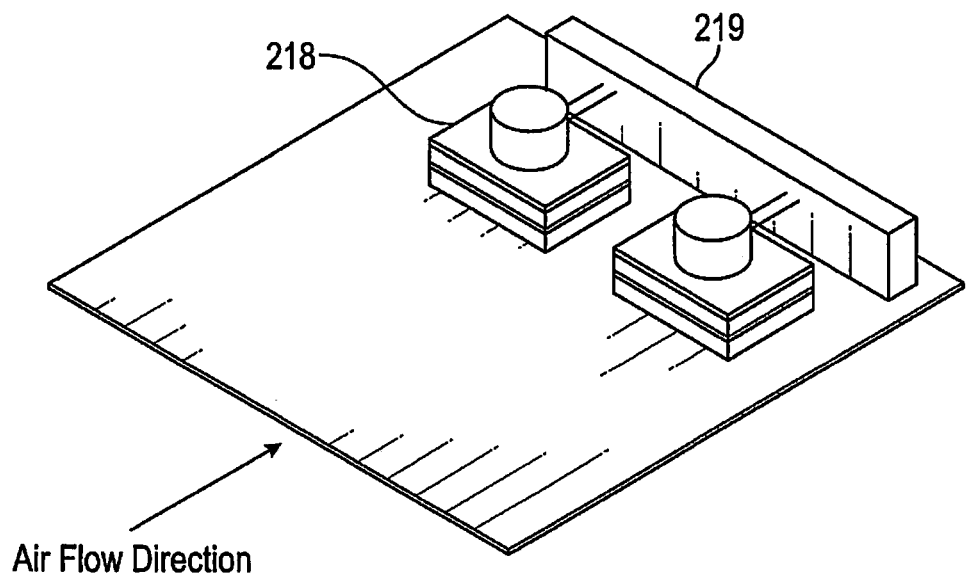

The fluid-operated heat activated pumps 218 of multiple devices can be joined together to a common condenser 219, as seen in FIG. 9. This ensures that if any one device is running hotter than the others, the cooler device's thermal budget can be consumed by the device requiring more cooling. Thus, the overall thermal performance of the PCBA is optimized. If all the devices are running hotter than target, the heat activated pumps on all the devices will run faster (higher flowrate) while maintaining the devices at their target operating temperature.

The condenser 219 can also be placed in front of the target device so the condenser receives the coolest incoming air and the hot air it releases downstream can be directed at the device to ensure it runs hot.

The heat activated pumps on each device interconnected, convert part of the collective heat dissipated by the devices into useful work to pump the cooling fluid around the devices, to maintain them at a constant target temperature.

Heat Activated Pump for Cooling of Low Wattage Electronics (Smartphones, Wearables, Flat Panels, Etc.)

Figure 10:
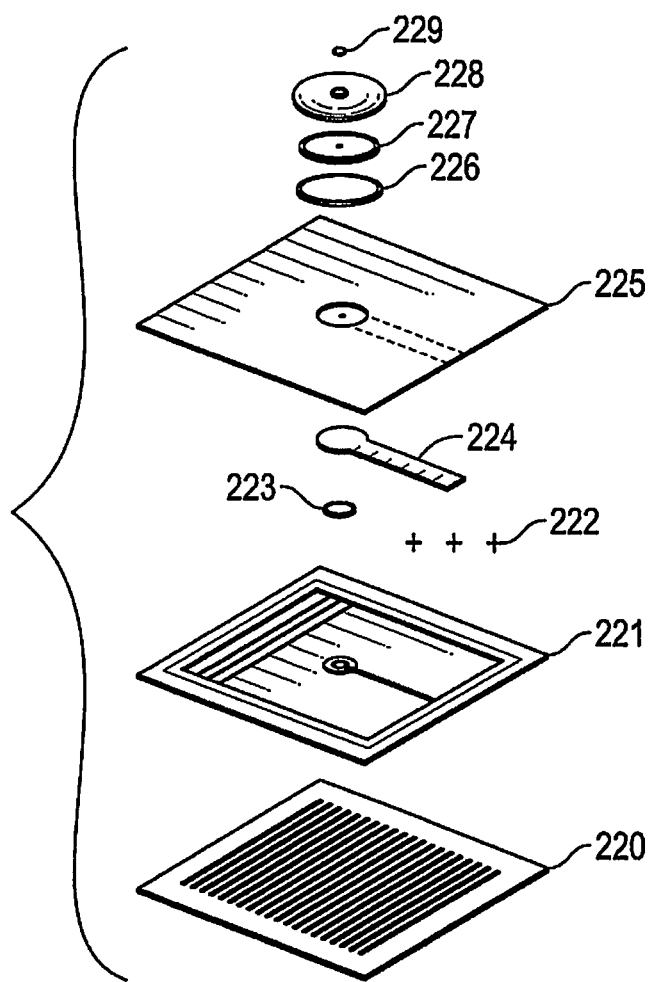
FIG. 10 is an exploded perspective view of a heat activated pump as in FIG. 1 for cooling of space-constrained electronics (as in a smartphone or wearable).
Figure 11:
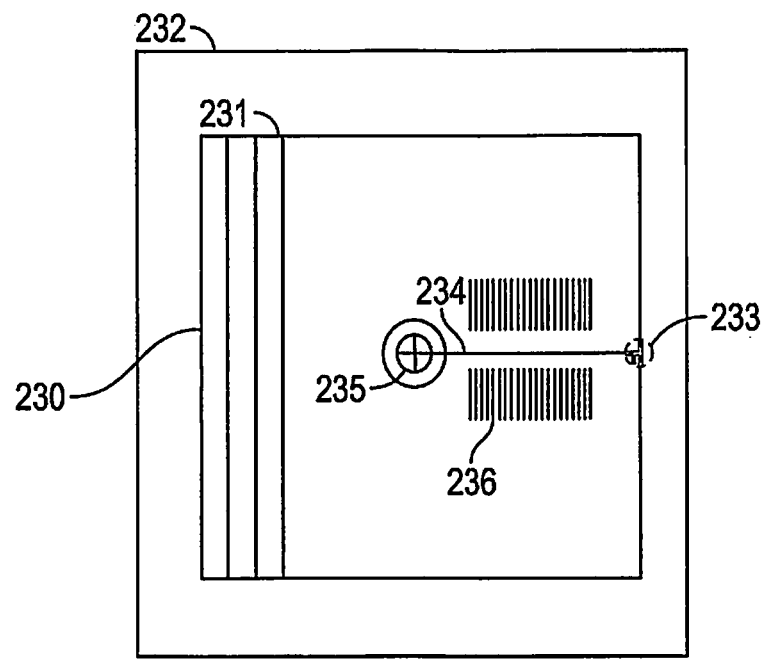
FIG. 11 is a top view of the pressure control valve, piston chamber, and condenser portion of the heat activated pump of FIG. 10.
Figure 12:
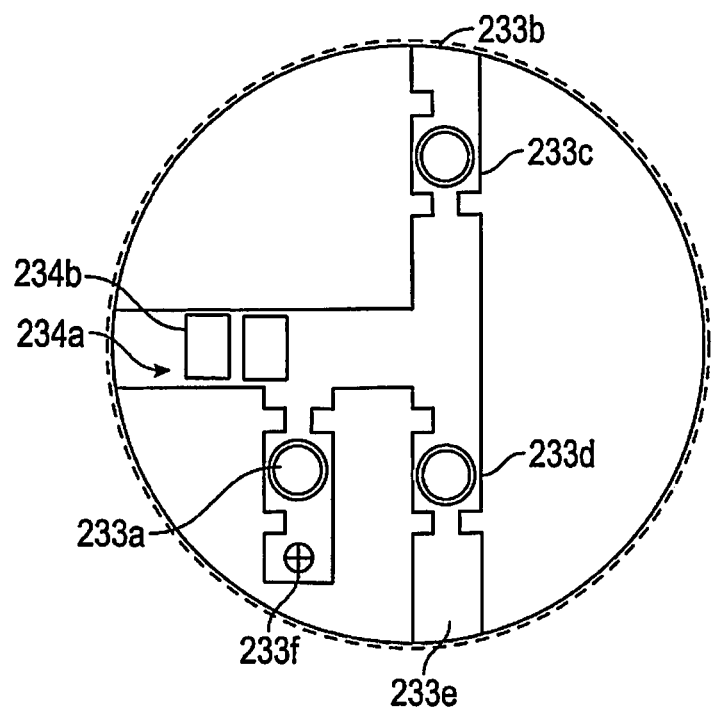
FIG. 12 is a close-up view of piston chamber valves of FIG. 11.

A fluid-operated heat activated pump for space-constrained devices (smartphones, wearables, etc.) is shown in FIGS. 10-12. Details of each constituent are:

| Element | Material Options | Description |
| --- | --- | --- |
| Chip 220 | Standard Industry Materials | Generic designator for the device that needs to be cooled. It could be a logic chip, memory, optical device etc. It could be a single monolith or a heterogeneous device complex. The silicon chip could have microchannels fabricated on the back side, using a standard Deep Reactive Ion Etching (DRIE) process, typically 50 microns deep. The purpose of the microchannels is to increase the surface area, to enhance boiling. Conventional silicon microchannels have the challenge of restricting the flow of fluid (due to their small dimensions and thus increased resistance to fluid flow). However, this application of silicon microchannels is different because fluid is not pushed through them. Instead, they serve as "fins" to enable faster heat transfer for boiling. |
| Evaporator Plate 220 (combined with the chip) | Thermal insulator material: plastic, | The side facing the chip has 2 holes: one for vapor egress 233f and another for liquid ingress 233e. The edges of the |

| Element | Material Options | Description |
|---|---|---|
| | polymer, ceramic etc. | evaporator plate 220 are bonded to the chip using any industry standard technique: solder, brazing, non-outgassing adhesive, welding etc. |
| Pressure Control Valve - Load Disc 223 | Thermal insulator material: plastic, polymer, ceramic etc. | The load disc 223 transfers pressure from the deadweight to the evaporator hole to prevent vapor from exiting before the deadweight pressure is reached. The disc could be used standalone or with a gasket/O-ring to achieve leak free contact. The disc could also be a sphere. |
| Pressure Control Valve - Diaphragm 224 | Silicone, Rubber, or other flexible material that can withstand working vapor pressure, chemical and temperature conditions. It could also be fabricated from silicon or silicon carbide using standard wafer lithography techniques | Diaphragm 224 is designed to flex to allow vapor to escape into second chamber when pressure exceeds target load. If there is no space for a deadweight, the diaphragm itself can be stiffened to act as the deadweight by tuning its thickness. The diaphragm can be replaced with O-rings or metal bellows in other embodiments as needed. The diaphragm material is extended to cover above the piston area as well, where it serves as a thermal insulator preventing heat from leaving the piston 234 through the top high thermal conductivity metal heat spreader. |
| Pressure Control Valve - Load Seat 226 | Metal or plastic - high rigidity. | The seat 226 applies a mechanical advantage by balancing the force of the load 223 on top of it with the vapor counter-pressure from the valve seat. Grooves on the top surface keep the load 223 centered on the load seat 226. |
| Pressure Control Valve - Gasket 227 | High Temp, Fluid Vapor Resistant (e.g., Silicone) | Thin, flexible gasket 227 is designed to seal a liquid load on top of the load seat 226. |
| Single Plate Housing 232 | Any insulating and rigid material | This accommodates the piston chamber 221, heat exchanger 230 with channels 231, and the valves 233a-f, 235 in a single plate with small form factor. |
| Piston Chamber 221 | NA | This is a cavity with input port 215 and built into the evaporator plate 220, towards the heat spreader side. The groove can be a single channel, or it can be a serpentine channel depending on how much volume needs to be displaced. Backstops 234a-b are embedded in the piston groove 234 (in current generating applications only) to ensure that magnetic material suspended in the liquid does not leave the piston-chamber. |
| Heat Exchanger 230 | NA | This is a cavity 230 built into the evaporator plate 220. It could be a single channel, or a series of channels 231 connected together in parallel. The heat exchanger |

| Element | Material Options | Description |
|---|---|---|
| | | could also be completely off-the-chip depending on the amount of heat loss required. |
| Inductive electrical generator 236 | Copper winding and ferro-magnetic material | This interacts with magnetic material between the backstops 234a-b to induce a current in the windings 236. |
| Valves 233a-f, 235 | NA | These are cavities with specific obstructions built into the chambers to allow fluid to flow uni-directionally. 233a is the injector return check valve with small hole 233f returning working fluid (in liquid form) back to the evaporator; 233c is the pump-exit check valve with a groove 233b forming a first exit port of the liquid-piston chamber; 233d is the suction-entry check valve coupled to a groove 233e forming the return port of the liquid-piston chamber. |
| Piston Cover and Heat Spreader 225 | High Thermal Conductivity Material: Copper, Aluminum etc. | This plate closes the pump and isolates it to protect it. It also transfers heat from the condenser 230 to the ambient environment. It could be attached with thermal adhesive to the chassis of a smartphone, watch etc. A finned heatsink could also be attached to the top if there is convective air cooling available. |
| Valve Balls 222 | Plastic, Metal (Steel, Tungsten etc.), Rubber, Ceramic | Balls 222 (could also be thin discs) designed to allow only unidirectional flow as desired. O-rings could also be used with the balls to ensure tight seals |
| Pressure Valve Gasket 227 | High Temp, Fluid Vapor Resistant (e.g., Silicone) | Thin, flexible gasket 227 designed to seal the vapor entry into the pump |
| Load Cover 228 | Rigid sheet metal or plastic, preferably heat insulating. If liquid is used, could be made of rubber or other flexible material. Could be bolted, welded, or soldered on to the heatsink body | Designed to hold the load 223 (solid or liquid) in place and prevent it from falling off. Also designed to provide a "back-stop" to ensure that the load does not displace excessively due to vapor pressure in case the diaphragm fails. |
| Load Cover Top 229 | Metal or Plastic, Rigid | This is needed when a liquid load is used. The liquid load is poured into the load cover to the desired height and then the top is used to seal the cover to prevent spillage. |

In vertical space constrained applications, a deadweight load cannot be used, especially if the operating temperature is high. In such situations, the diaphragm itself could be stiffened to act as the load by selecting the appropriate thickness, material, and diameter. In situations where a diaphragm cannot be used, a spring or a liquid dead weight (like Gallium) can be used. The operating principle is Pascal's law: the pressure in a fluid is always the same and the pressure is a function of the height of the fluid.

Taller columns produce higher counterweight. In some situations, the counterweight load may need to be dynamically changed (increased or decreased) while the unit is operating. For instance: the ambient temperature temporarily increases beyond nominal values. A higher ambient temperature means a higher flowrate is required through the condenser to transfer the same amount of heat. If the duty load on the chip is low, the temperature of the chip can be raised slightly, so the pump does more work and increases the flowrate through the condenser. This increase in chip temperature can be accomplished by raising the deadweight value: by increasing the height of the liquid column. This can be achieved by using a bimetallic strip which contracts in diameter, thus raising the height of the liquid column.

In applications where the ambient temperature is too high (e.g., a smartphone left on a car dashboard or an electronic device in a higher than specified ambient environment), the pump will act as a "thermal switch" where heat from outside the device will not be conducted back into the device. It accomplishes this because the pump is designed to transfer heat from the evaporator to the condenser. If the condenser temperature exceeds the evaporator temperature, the pump will cease to function until the condenser temperature drops below the evaporator temperature.

What is claimed is:

1. A heat-activated pump for removal of heat from one or more electronic components, comprising:
    an evaporator containing a working fluid and directly coupled against the one or more electronic components so as to receive the heat from the one or more electronic components to convert a liquid phase of the working fluid into a vapor phase of the working fluid;
    a pressure-control valve coupled to an exit port of the evaporator and maintaining the working fluid in the evaporator at a set target pressure and allowing the vapor phase of the working fluid to escape through the exit port whenever the set target pressure is exceeded;
    a liquid-piston chamber coupled to the pressure-control valve to receive the vapor phase of working fluid from the evaporator at the set target pressure, the vapor phase of working fluid expanding adiabatically and displacing a liquid within the liquid-piston chamber, the liquid comprising a portion of the liquid phase of the working fluid, expelling the liquid from the liquid-piston chamber in a pumping stage of a thermodynamic cycle;
    a unidirectional pump-exit check valve coupled to a first exit port of the liquid-piston chamber to allow the displaced liquid to exit the liquid-piston chamber;
    a unidirectional liquid suction-entry check valve coupled to a return port of the liquid-piston chamber to allow the liquid to enter the liquid-piston chamber;
    a heat exchanger with a heatsink, the heat exchanger coupled to the unidirectional pump-exit check valve and the unidirectional liquid suction-entry check valve, the heat exchanger to receive the displaced liquid via the unidirectional pump-exit check valve and allow the liquid via the unidirectional liquid suction-entry check valve to return to the liquid-piston chamber in a suction stage of the thermodynamic cycle, the heatsink radiating at least a portion of the heat away to a flow of cooler air; and
    a unidirectional injector return check valve coupled to both a second exit port of the liquid-piston chamber and to an input port of the evaporator, wherein periodic pressure pulses of the liquid phase of the working fluid from the liquid-piston chamber that temporarily exceed the set target pressure in the evaporator facilitate jets of the liquid phase of the working fluid to return to the evaporator in successive brief spurts.

2. The heat-activated pump as in claim 1, wherein the pressure-control valve has the set target pressure being tunable for a specified operating temperature of the one or more electronic components.

3. The heat-activated pump as in claim 1, wherein the liquid in the liquid-piston chamber is just the portion of the liquid phase of the working fluid.

4. The heat-activated pump as in claim 1, wherein the liquid further comprises another liquid, the another liquid disposed at least in the liquid-piston chamber is a different immiscible liquid of different density from the liquid phase of the working fluid, the heat-activated pump further comprising a separator coupled between the liquid-piston chamber and the first and second exit ports of the liquid-piston chamber to direct the liquid phase of the working fluid to the unidirectional injector return check valve leading back to the evaporator and the displaced liquid to the unidirectional pump-exit check valve leading to the heat exchanger.

5. The heat-activated pump as in claim 1, further comprising a permanent magnetic material within the liquid in the liquid-piston chamber and an induction electrical generator surrounding the liquid-piston chamber.

6. The heat-activated pump as in claim 1, wherein the heatsink is located upstream in the flow of the cooler air warming the cooled air, the warmed air then flowing past the one or more electronic components and the evaporator.

7. The heat-activated pump as in claim 1, wherein the one or more electronic components coupled to the evaporator form part of a rack in a datacenter.

8. The heat-activated pump as in claim 7, wherein a network of multiple ones of the heat-activated pump is provided for each of a group of the one or more electronic components in the rack.

9. A method of removing heat from one or more electronic components by means of a heat-activated pump, comprising:
    transferring the heat from the one or more electronic components directly to an evaporator to convert a liquid phase of a working fluid therein to a vapor phase of the working fluid;
    allowing, whenever a set target pressure in the evaporator is exceeded, the vapor phase of working fluid to escape into a liquid-piston chamber through a pressure-control valve coupled to an exit port of the evaporator, the vapor phase of working fluid expanding adiabatically and displacing a liquid within the liquid-piston chamber to expel the liquid from the liquid-piston chamber through a first exit port with a unidirectional pump-exit check valve in a pumping stage of a thermodynamic cycle, the liquid comprising a portion of the liquid phase of the working fluid;
    returning jets of the liquid phase of the working fluid to the evaporator through an input port of the evaporator coupled to a unidirectional injector return check valve in period pressure pulses of the liquid phase of the working fluid from a second exit port of the liquid-piston chamber when the liquid phase of the working fluid temporarily exceeds a pressure in the evaporator;
    receiving the displaced liquid from the liquid-piston chamber in a heat exchanger coupled to the unidirectional pump-exit check valve, the heat exchanger having a heatsink, the heatsink radiating at least a portion of the heat away to a flow of cooler air;

allowing the liquid in the heat exchanger to return through a unidirectional liquid suction-entry check valve coupled to a return port of the liquid-piston chamber in a suction stage of the thermodynamic cycle; and repeating the foregoing steps in multiple ones of the thermodynamic cycle.

10. The method as in claim 9, wherein the set target pressure set of the pressure-control valve is tunable for achieving a specified operating temperature of the one or more electronic components.

11. The method as in claim 9, wherein the heatsink is located upstream in the flow of the cooler air warming the cooled air, the warmed air then flowing past the one or more electronic components and the evaporator.

12. A heat-activated pump for removal of heat from a data center, comprising:

the data center having multiple electronic components generating heat;

a set of evaporators containing a working fluid, each of the evaporators directly coupled against one or more electronic components of the multiple electronic components to as to receive the heat from the one or more electronic components to convert a liquid phase of the working fluid into a vapor phase of the working fluid;

a pressure-control safety valve coupled via first piping running through the data center to a common exit port of the set of evaporators and maintaining the working fluid in the evaporator at a set target pressure and allowing the vapor phase of the working fluid in the first piping to escape through the common exit port whenever the set target pressure is exceeded;

a liquid-piston chamber coupled to the pressure-control valve to receive the vapor phase of working fluid from the set of evaporators at the set target pressure, the vapor phase of working fluid expanding adiabatically and displacing a liquid within the liquid-piston chamber, the liquid comprising a portion of the liquid phase of the working fluid, expelling the liquid from the liquid-piston chamber in a pumping stage of a thermodynamic cycle;

a unidirectional pump-exit check valve coupled to a first exit port of the liquid-piston chamber to allow the displaced liquid to exit the liquid-piston chamber;

a unidirectional liquid suction-entry check valve coupled to a return port of the liquid-piston chamber;

a shared heat exchanger with a heatsink, the heat exchanger coupled to the unidirectional pump-exit check valve and the unidirectional liquid suction entry check valve to receive the displaced liquid via the unidirectional pump-exit check valve and allow the displaced liquid via the unidirectional liquid suction-entry check valve to return to the liquid-piston chamber in a suction stage of the thermodynamic cycle, the heatsink radiating at least a portion of the heat away to a flow of cooler air; and a unidirectional injector return check valve coupled to both a second exit port of the liquid-piston chamber and second piping running through the data center to respective input ports of the set of evaporators, wherein periodic pressure pulses of the liquid phase of the working fluid from the liquid-piston chamber that temporarily exceed the set target pressure in the set of evaporators facilitate jets of the liquid phase of the working fluid to return to the set of evaporators in successive brief spurts.

13. The heat-activated pump as in claim 12, wherein the multiple electronic components are mounted on circuit boards organized in racks of the data center, each of the circuit boards having at least one evaporator of the set of evaporators, and the first piping running through the data center from the set of evaporators to the common exit port and the second piping running from the return check valve to the respective input ports of the set of evaporators forms a working fluid circulation system for the data center that is coupled to the shared heat exchanger.

14. The heat-activated pump as in claim 12, wherein the liquid in the liquid-piston chamber is just the portion of the liquid phase of the working fluid.

15. The heat-activated pump as in claim 12, wherein the liquid further comprises another liquid, the another liquid disposed at least in the liquid-piston chamber is a different immiscible liquid of different density from the liquid phase of the working fluid, the heat-activated pump further comprising a separator coupled between the liquid-piston chamber and the first and second exit ports of the liquid-piston chamber to direct the liquid phase of the working fluid to the unidirectional injector return check valve leading back to the set of evaporators and the displaced liquid to the unidirectional pump-exit check valve leading to the shared heat exchanger.

16. The heat-activated pump as in claim 12, further comprising a permanent magnetic material within the liquid in the liquid-piston chamber and an induction electrical generator surrounding the liquid-piston chamber.

17. A method of removing heat by means of a heat activated pump from a data center having multiple electronic components, comprising:

transferring the heat from multiple electronic components directly to a set of evaporators to convert a liquid phase of a working fluid therein to a vapor phase of the working fluid;

allowing, whenever a set target pressure in the set of evaporators is exceeded, the vapor phase of the working fluid to escape into a liquid-piston chamber through a pressure-control safety valve coupled via first piping running through the data center to a common exit port of the set of evaporators, the vapor phase of the working fluid expanding adiabatically and displacing a liquid within the liquid-piston chamber to expel the liquid from the liquid-piston chamber through a piston exit port with a unidirectional pump-exit check valve in a pumping stage of a thermodynamic cycle, the liquid comprising a portion of the liquid phase of the working fluid;

returning jets of the liquid phase of the working fluid via second piping running through the data center to the set of evaporators via respective input ports of the set of evaporators coupled to a unidirectional injector return check valve in period pressure pulses of the liquid phase of the working fluid from the liquid-piston chamber that temporarily exceed the set target pressure in the set of evaporators;

receiving the displaced liquid from the liquid-piston chamber in a shared heat exchanger coupled to the unidirectional pump-exit check valve, the shared heat exchanger having a heatsink, the heatsink radiating at least a portion of the heat away to a flow of cooler air;

allowing the liquid in the shared heat exchanger to return through a unidirectional liquid suction-entry check valve coupled to a return port of the liquid-piston chamber in a suction stage of the thermodynamic cycle; and repeating the foregoing steps in multiple ones of the thermodynamic cycle.

* * * * *